United States Patent [19]

Schmidt

[11] Patent Number: 5,251,098

[45] Date of Patent: Oct. 5, 1993

[54] MULTIPLE TRANSISTOR CLAMPING DEVICE AND METHOD

[75] Inventor: Detlef W. Schmidt, Schaumburg, Ill.

[73] Assignee: Motorola, Inc., Schaumburg, Ill.

[21] Appl. No.: 829,122

[22] Filed: Jan. 31, 1992

[51] Int. Cl.[5] .............................................. H05K 7/20
[52] U.S. Cl. .................................... 361/717; 174/16.3;
165/185; 361/710; 361/714; 257/718
[58] Field of Search ............... 361/383, 386, 388, 389;
357/79, 81; 174/16.3; 165/185, 893; 363/141,
144

[56] References Cited

U.S. PATENT DOCUMENTS

| | | | |
|---|---|---|---|
| 4,288,839 | 9/1981 | Prager et al. | 361/386 |
| 4,739,447 | 4/1988 | Lecomte | 361/386 |
| 4,853,828 | 8/1989 | Penn | 361/386 |
| 5,031,074 | 7/1991 | Ravid | 361/413 |

Primary Examiner—Leo P. Picard
Assistant Examiner—Young S. Whang
Attorney, Agent, or Firm—Darleen J. Stockley

[57] ABSTRACT

A heat sink-hybrid circuit assembly clamping device (100) and method (200) are provided for minimizing hybrid circuit assembly substrate-transistor solder joint stress. The clamping device is positioned and selected to provide a net coefficient of linear expansion (CLE) substantially of a magnitude equal to a net coefficient of the substrate material such that uniform pressure and contact are obtained between the transistors of hybrid circuit assemblies and the heat sink.

30 Claims, 1 Drawing Sheet

MULTIPLE TRANSISTOR CLAMPING DEVICE AND METHOD

FIELD OF THE INVENTION

This invention relates generally to hybrid circuit assemblies and more particularly to multi-transistor hybrid circuit assemblies.

BACKGROUND

Leads of multiple transistors are often soldered to a common substrate or printed circuit board in hybrid circuit assemblies. When transistors are further joined to a heat sink with screws, a difference in thermal expansion coefficients for the substrate or printed circuit board and the heat sink results in stress on solder joints as assemblies are thermally cycled. These stresses cause solder creep between the transistor leads and the substrates, eventually causing distortion of the leads and electrical failure.

There is a need for a more reliable multiple transistor clamping device that provides for mounting of multiple transistor assemblies to a heat sink while simultaneously minimizing thermal expansion forces due to differences in thermal expansion coefficients

SUMMARY OF THE INVENTION

A heat sink-hybrid circuit assembly clamping device and method for providing same are included. The clamping device is positioned and selected to have a net coefficient of linear expansion (CLE) substantially matched for cancelling that of shared substrates of hybrid circuit assemblies that are soldered to common transistors, such that hybrid circuit assembly substrate-transistor solder joint stress is minimized, comprising at least: an elongated central member (CEM) including first and second end portions and having means for coupling said CEM to a heat sink, and at least two elongated cantilever members (CAMs), each having first and second end portions for facilitating uniform pressure and contact between the transistors of hybrid circuit assemblies and the heat sink, wherein coupling means is utilized for distally coupling each first CAM end portion to one of the CEM end portions.

BRIEF DESCRIPTIONS OF THE DRAWINGS

FIG. 1, numeral 100, sets forth a first exemplary embodiment a heat sink-hybrid circuit assembly clamping device in accordance with the present invention.

FIG. 2, numeral 200, sets forth a flow chart of steps in accordance with the method of the present invention.

DETAILED DESCRIPTION OF A PREFERRED EMBODIMENT

The present invention provides for minimizing transistor-substrate solder joint stress for transistors soldered to shared substrates of hybrid circuit assemblies. Thus, where at least two transistors are soldered to shared alumina substrates that are mounted to a common heat sink, the clamping device utilizes a net coefficient of linear expansion that substantially equals a coefficient of linear expansion (CLE) of the substrates, minimizing thermal expansion stress in the transistor lead solder joints. Typically, each transistor is mounted on a base material, such as beryllium oxide (beryllia), and further mounted onto a metal flange, commonly copper or Kovar. In the present invention the transistor flange is then put directly into floating contact with the heat sink to remove heat generated by the transistor, typically utilizing a thermal grease between the transistor flange and the heat sink. The heat transfer is facilitated by the clamping device pressing the transistor flange to the heat sink, the thermal grease facilitating the thermal contact. Because the transistors are not screwed to the heat sink, they can slide on top of the heat sink and prevent the transfer of stress to the solder joint of the transistor leads to the hybrid assembly. Thus, fatigue and failure rates of such assemblies is reduced.

Figure 1:
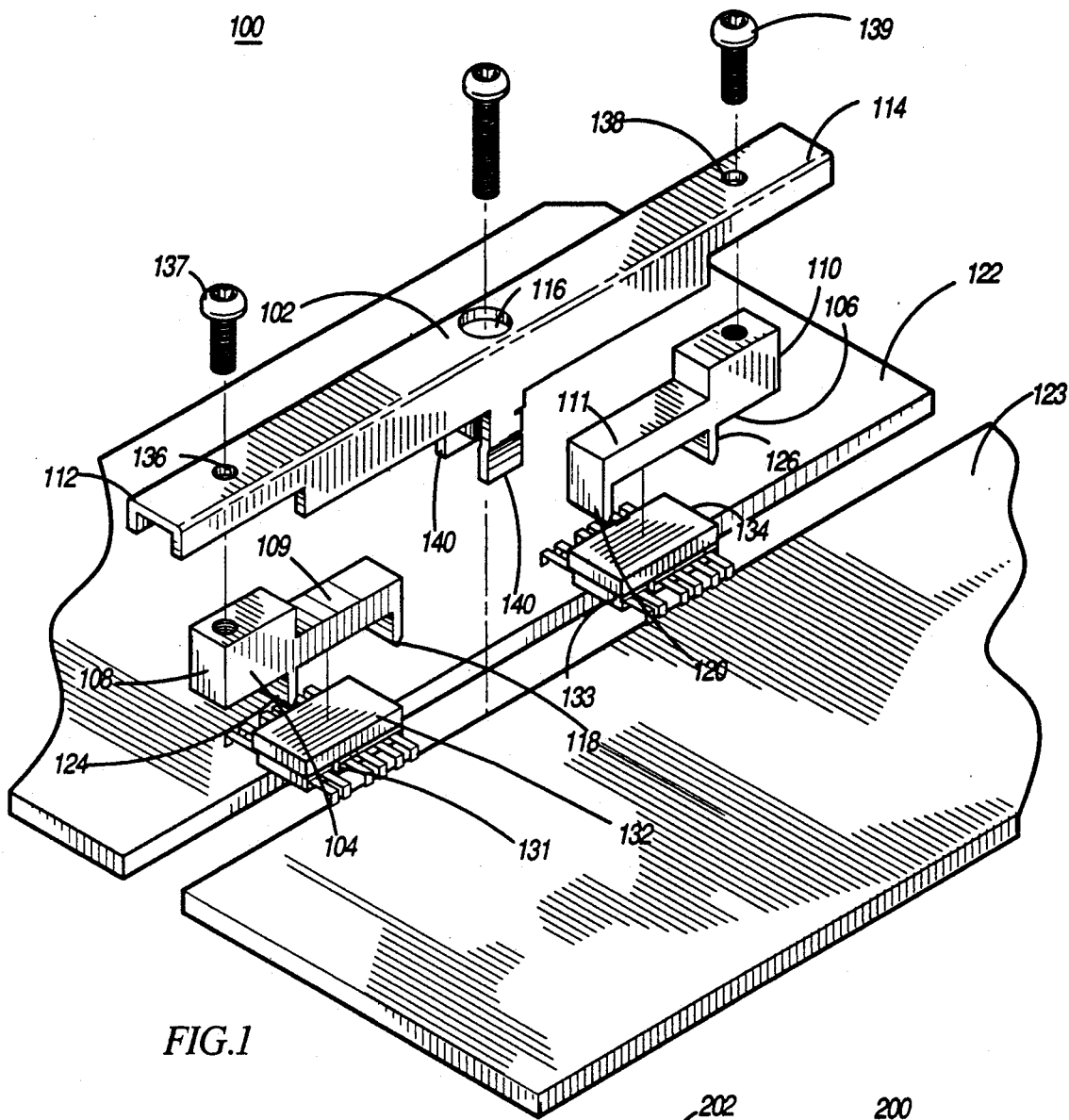

FIG. 1, numeral 100, sets forth a first exemplary embodiment a heat sink-hybrid circuit assembly clamping device in accordance with the present invention. Components of the clamping device are selected and attached in a manner that provides a net CLE matched for substantially cancelling that of the hybrid circuit assembly substrates. The clamping device (100) comprises at least an elongated central member (CEM) (102) including first and second end portions and having means for coupling the CEM (102) to a heat sink (heat sink not illustrated), and two elongated cantilever members (CAMS) (104, 106), each having first (108, 110) and second end portions (109, 111) for facilitating uniform pressure and contact between transistors of hybrid circuit assemblies and the heat sink, wherein coupling means is utilized for distally coupling each first CAM end portion (108, 110) to one of the CEM end portions (112, 114).

The CAMs (104, 106) are comprised of a material that has a CLE that is substantially equal to a sum of the CLE of a material of the shared substrates and the CLE of a CEM material. For example, the CEM (102) may be selected to comprise 416 stainless steel, a material that has a CLE of 5.5 ppm/deg F., and the CAMs (104, 106) may be selected to comprise 303 stainless steel, a material that has a CLE of 9.5 ppm/deg F. The CAMs (104, 106) are coupled to the CEM at a CEM center to coupling distance that is greater than a CEM center to transistor center distance, substantially providing a negative CLE of the CAMs with respect to the CEM. Where the CEM has a length of A, each CAM has a length of B (B is less than half of A), x is a distance between mounting points of the CAMs to the CEM, and y is a distance from a center of a transistor (proximate to a CAM) to the mounting point of the CAM, a total expansion distance for a selected change in temperature is:

$$\text{total expansion} = (A_{CTE} * x * °F.) - (B_{CTE} * 2 * y * °F.).$$

Thus, the clamp provides a close approximation of the CLE of alumina ($Al_2O_3$), a typical substrate material, that has a CLE of 4.6 ppm/deg F.

The CEM (102) typically includes an aperture (116) located substantially centrally with respect to the first and second CEM end portions. A screw, for example, may be utilized as the means for coupling said CEM (102) to the heat sink.

The coupling means typically includes CEM-CAM coupling apertures (136, 138) in each of the first and second end portions of the CEM (102), and screws (137, 139) for utilizing each CEM-CAM coupling aperture (136, 138) to couple the CEM (102) to the CAM first end portions ((108, 110). Generally, each CAM (104, 106) includes at least two legs (118, 120, 124, 126) for facilitating uniform pressure and contact between the transistors of hybrid circuit assemblies and the heat sink.

Typically each first leg (118, 120) is located proximate to the second end portion (109, 111) of each CAM (104, 106), and each second leg (124, 126) of the CAM is positioned straddling the transistor (131, 133).

In this embodiment each CAM (104, 106) includes at least a second leg (124, 126) positioned on each of two transistors (128, 130) that are soldered to the shared substrates (122, 123) of the hybrid circuit assembly, wherein each transistor (131, 133) has a flange (132, 134) coupled thereto and extending from first and second sides of the transistor. Thus, each CAM (104, 106) has a first CAM leg (118, 120) biased against the transistor flange on the first side of the transistor that facilitates uniform pressure of the clamping device on the transistor flange first side, and a second CAM leg (124, 126) biased against the transistor flange on the second side of the transistor that facilitates uniform pressure of the clamping device on the transistor flange second side to the CAMs (104, 106).

Where selected, the CEM (102) includes a stopping means for providing a distance between the heat sink and the CEM (102) such that a predetermined force is obtained between the transistor flange (132, 134) and the heat sink. For example, a pair of legs (140) extending substantially centrally with respect to the first and second CEM end portions in a direction toward the heat sink may be utilized for the stopping means.

Where desired, the end portions of the CEM (102) may be shaped to allow detachable attachment to a hybrid assembly bracket such that the clamp facilitates maintaining parallel positioning of soldered transistors (131, 133) to the hybrid circuit assembly substrates (122, 123).

Figure 2:
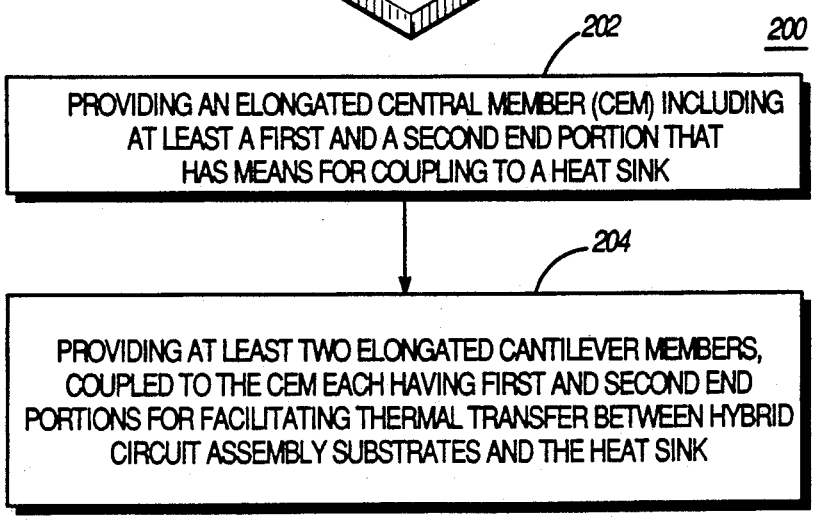

FIG. 2, numeral 200, sets forth a flow chart of steps in accordance with the method of the present invention. The method provides a heat sink-hybrid circuit assembly clamping device positioned and selected to have a net coefficient of linear expansion (CLE) that substantially cancels that of shared substrates of hybrid circuit assemblies that are soldered to common transistors, such that hybrid circuit assembly substrate-transistor solder joint stress is minimized, comprising at least (1) providing an elongated central member (CEM) including first and second end portions and having means for coupling said CEM to a heat sink (202), and (2) providing at least two elongated cantilever members (CAMs) coupled to the CEM, each having first and second end portions for facilitating uniform pressure and contact between the transistors of hybrid circuit assemblies and the heat sink, wherein coupling means is utilized for distally coupling each first CAM end portion to one of the CEM end portions (204).

As described above, the CAMs are comprised of a material that has a CLE that is substantially equal to the sum of the CLE of the substrates plus the CLE of a material of the CEM. Typically, the materials of the CEM and CAMs are selected stainless steel compositions.

The method may further include the steps of providing an aperture in the CEM located substantially centrally with respect to the first and second CEM end portions, and coupling the CEM to the heat sink with a screw that utilizes the aperture.

Each CAM may be selected to include at least two legs for facilitating uniform pressure and contact between the transistors of hybrid circuit assemblies and the heat sink. Each first leg is generally located substantially proximate to the second end portion of each CAM. Also, at least a second leg is provided, positioned such that each of two transistors, each having a flange coupled thereto and extending from first and second opposing sides of the transistor, the transistors being soldered to the substrates of the hybrid circuit assemblies, has the second CAM leg biased against the second side of the transistor flange for facilitating unitform pressure between the transistor flange and the heat sink.

The method may include providing CEM-CAM coupling apertures in each of the first and second end portions of the CEM, and utilizing at least two screws inserted through the CEM-CAM coupling apertures to couple the CEM to the CAM first end portions.

Further, the method may include the step of providing a distance between the heat sink and the CEM such that a predetermined force is obtained between between the transistor flange (132, 134) and the heat sink. Typically, providing a distance comprises providing at least a pair of legs extending substantially centrally with respect to the first and second CEM end portions in a direction toward the heat sink. The end portions of the CEM may be shaped to allow detachable attachment to a hybrid circuit assembly bracket such that the device facilitates maintaining parallel positioning of soldered transistors to the substrates of the hybrid circuit assemblies.

Although a description of an embodiment of the present invention has been described and shown in the drawings, the scope of the invention is defined by the claims which follow.

I claim:

1. A heat sink-hybrid circuit assembly clamping device having a net coefficient of linear expansion (CLE) substantially equal to a net coefficient of shared substrates of hybrid circuit assemblies that are soldered to common transistors, such that hybrid circuit assembly substrate-transistor solder joint stress is minimized, comprising at least:
    A) an elongated central member (CEM) including first and second end portions and having means for coupling said CEM to a heat sink, and
    B) at least two elongated cantilever members (CAMs), each having first and second end portions for facilitating uniform pressure and contact between the transistors of said hybrid circuit assemblies and the heat sink, wherein coupling means is utilized for distally coupling each first CAM end portion to one of the CEM end portions.

2. The clamping device of claim 1 wherein:
    A) said CEM includes an aperture located substantially centrally with respect to the first and second CEM end portions, and
    B) the means for coupling said CEM to the heat sink comprises a screw that utilizes the aperture to fasten the CEM to the heat sink.

3. The clamping device of claim 1 wherein each CAM includes at least two legs straddling each transistor for facilitating uniform pressure and contact between the transistors of said hybrid circuit assemblies and the heat sink.

4. The clamping device of claim 3 wherein each first leg is located substantially at the second end portion of each CAM.

5. The clamping device of claim 4 wherein each CAM includes at least a second leg positioned such that each of two transistors, each having a flange coupled thereto and extending from first and second opposing sides of the transistor, the transistors being soldered to the substrates of the hybrid circuit assemblies, has the second CAM leg biased against the second side of the transistor for facilitating uniform pressure and contact between the transistors of said hybrid circuit assemblies and the heat sink.

6. The clamping device of claim 5 wherein the CEM includes a stopping means for providing a distance between the heat sink and the CEM such that a predetermined force is obtained between the flange and the heat sink.

7. The clamping device of claim 6 wherein the stopping means comprises at least a pair of legs extending substantially centrally with respect to the first and second CEM end portions in a direction toward the heat sink.

8. The clamping device of claim 1 wherein the coupling means includes:
   A) CEM-CAM coupling apertures in each of the first and second end portions of the CEM, and
   B) at least two screws for utilizing each CEM-CAM coupling aperture to fasten the CEM to the CAM first end portions.

9. The clamping device of claim 1 wherein the end portions of the CEM are shaped to allow detachable attachment to said hybrid circuit assembly bracket such that the device facilitates maintaining parallel positioning of soldered transistors to the substrates of the hybrid circuit assemblies.

10. A heat sink-hybrid circuit assembly clamping device having a net coefficient of linear expansion (CLE) substantially equal to a net coefficient of shared substrates of hybrid circuit assemblies that are soldered to common transistors, such that hybrid circuit assembly substrate-transistor solder joint stress is minimized, comprising at least:
   A) an elongated central member (CEM) including first and second end portions and having coupling means, and
   B) at least two elongated cantilever members (CAMs), each having first and second end portions of facilitating uniform pressure and contact between the transistors of said hybrid circuit assemblies and a heat sink, wherein coupling means is utilized for distally coupling each first CAM end portion to one of the CEM end portions wherein, the CEM has a length of A, each CAM has a length of B (B is less than half of A), x is a distance between mounting points of the CAMs to the CEM, and y is a distance from a center of a transistor (proximate to a CAM) to the mounting point of the CAM,
   a total expansion distance for a selected change in temperature is total expansion=$(A_{CTE} * x * °F.) - (B_{CTE} * 2 * y * °F.)$ and the CAMs are comprised of a material that has the CLE that is substantially equal to the sum of the CLE of the substrates plus the CLE of a material of the CEM.

11. The clamping device of claim 10 wherein the materials of the CEM and CAMs are selected stainless steel compositions.

12. A heat sink-hybrid circuit assembly clamping device having a net coefficient of linear expansion (CLE) substantially equal to a net coefficient of two shared substrates of hybrid circuit assemblies, such that hybrid circuit assembly substrate-transistor solder joint stress is minimized, wherein two transistors have thermally conductive flanges attached thereto and include transistor leads that are soldered to each of the two shared substrates, comprising at least:
   A) an elongated central member (CEM) including first and second end portions and having an aperture located substantially centrally with respect to the first and second end portions, for receiving a fastening means for fastening said CEM to a heat sink, and
   B) two elongated cantilever members (CAMs), each having first and second end portions with a pair of legs proximate to the CAM second end portions and biased against the flanges for facilitating uniform pressure and contact between the transistors of said hybrid circuit assemblies and the heat sink, wherein coupling means is utilized for distally coupling each first CAM end portion to one of the CEM end portions.

13. The clamping device of claim 12 wherein materials of the CEM and CAMs are selected stainless steel compositions.

14. The clamping device of claim 12 wherein the coupling means includes:
   A) CEM-CAM coupling apertures in each of the first and second end portions of the CEM, and
   B) at least two screws for utilizing each CEM-CAM coupling aperture to fasten the CEM to the CAM first end portions.

15. The clamping device of claim 12 wherein the CEM includes a stopping means for providing a distance between the heat sink and the CEM such that a predetermined force is obtained between the flange and the heat sink.

16. The clamping device of claim 15 wherein the stopping means comprises at least a pair of legs extending substantially centrally with respect to the first and second CEM end portions in a direction toward the heat sink such that a predetermined force is obtained between the flange and the heat sink.

17. The clamping device of claim 12 wherein the end portions of the CEM are shaped to allow detachable attachment to a hybrid circuit assembly bracket such that the device facilitates maintaining parallel positioning of soldered transistors to the substrates of the hybrid circuit assemblies.

18. The clamping device of claim 2 wherein, the CEM has a length of A, each CAM has a length of B (B is less than half of A), x is a distance between mounting points of the CAMs to the CEM, and y is a distance from a center of a transistor (proximate to a CAM) to the mounting point of the CAM, and
   a total expansion distance for a selected change in temperature is:

total expansion=$(A_{CTE} * x * °F.) - (B_{CTE} * 2 * y * °F.)$.

19. A heat sink-hybrid circuit assembly clamping device having a net coefficient of linear expansion (CLE) substantially equal to a net coefficient of two shared substrates of hybrid circuit assemblies, such that hybrid circuit assembly substrate-transistor solder joint stress is minimized, wherein two transistors have thermally conductive flanges attached thereto and include transistor leads that are soldered to each of the two shared substrates, comprising at least:
   A) an elongated central member (CEM) including first and second end portions and having an aperture located substantially centrally with respect to the first and second end portions, for receiving a fastening means for fastening said CEM to a heat-sink, and B) two elongated cantilever members (CAMs), each having first and second end portions with a pair of legs proximate to the CAM second end portions and biased against the flanges for facilitating uniform pressure and contact between the transistors of said hybrid circuit assemblies and the heat sink, wherein coupling means is utilized for distally coupling each first CAM end portion to one of the CEM end portions wherein the fastening means is a screw.

20. A method for providing a heat sink-hybrid circuit assembly clamping device having a net coefficient of linear expansion (CLE) that substantially equals a net coefficient of shared substrates of hybrid circuit assemblies that are soldered to common transistors, such that hybrid circuit assembly substrate-transistor solder joint stress is minimized, comprising at least:

A) providing an elongated central member (CEM) including first and second end portions and having means for coupling said CEM to a heat sink, and B) providing at least two elongated cantilever members (CAMs) coupled to the CEM, each having first and second end portions for facilitating uniform pressure and contact between the transistors of said hybrid circuit assemblies and the heat sink, wherein coupling means is utilized for distally coupling each first CAM end portion to one of the CEM end portions.

21. The method of claim 20 wherein materials of the CEM and CAMs are selected stainless steel compositions.

22. The method of claim 20 further including the steps of:

A) providing an aperture in the CEM located substantially centrally with respect to the first and second CEM end portions, and B) coupling the CEM to the heat sink with a screw that utilizes the aperture.

23. The method of claim 20 further including the step of providing that each CAM includes at least two CAM legs for facilitating uniform pressure and contact between the transistors of said hybrid circuit assemblies and the heat sink.

24. The method of claim 23 wherein each first leg is located substantially proximate to the second end portion of each CAM.

25. The method of claim 24 wherein each CAM includes at least a second leg positioned such that each of two transistors, each having a flange coupled thereto and extending from first and second opposing sides of the transistor, the transistors being soldered to the substrates of the hybrid circuit assemblies, has the second CAM leg biased against the second side of the transistor for facilitating uniform pressure and contact between the transistors of said hybrid circuit assemblies and the heat sink.

26. The method of claim 20 further including the steps of:

A) providing CEM-CAM coupling apertures in each of the first and second end portions of the CEM, and B) utilizing at least two screws inserted through the CEM-CAM coupling apertures to couple the CEM to the CAM first end portions.

27. The method of claim 20 further including the step of providing a distance between the heat sink and the CEM such that a predetermined force is obtained between the flange and the heat sink.

28. The method of claim 27 wherein providing the distance comprises providing at least a pair of legs extending substantially centrally with respect to the first and second CEM end portions in a direction toward the heat sink such that the predetermined force is obtained between the flange and the heat sink.

29. The method of claim 20 wherein the end portions of the CEM are shaped to allow detachable attachment to a hybrid circuit assembly bracket such that the device facilitates maintaining parallel positioning of soldered transistors to the substrates of the hybrid circuit assemblies.

30. A method for providing a heat sink-hybrid circuit assembly clamping device having a net coefficient of linear expansion (CLE) that substantially equals a net coefficient of shared substrates of hybrid circuit assemblies that are soldered to common transistors, such that hybrid circuit assembly substrate-transistor solder joint stress is minimized, comprising at least:

A) providing an elongated central member (CEM) including first and second end portions and having means for coupling said CEM to a heat-sink, and B) providing at least two elongated cantilever members (CAMs) coupled to the CEM, each having first and second end portions for facilitating uniform pressure and contact between the transistors of said hybrid circuit assemblies and the heat sink, wherein coupling means is utilized for distally coupling each first CAM end portion to one of the CEM end portions wherein, the CEM has a length of A, each CAM has a length of B (B is less than half of A), x is a distance between mounting points of the CAMs to the CEM, and y is a distance from a center of a transistor (proximate to a CAM) to the mounting point of the CAM, and a total expansion distance for a selected change in temperature is:

total expansion = $(A_{CTE} * x * °F.) - (B_{CTE} * 2 * y * °F.)$

* * * * *

UNITED STATES PATENT AND TRADEMARK OFFICE
CERTIFICATE OF CORRECTION

PATENT NO. : 5,251,098

DATED : October 5, 1993

INVENTOR(S) : Detlef W. Schmidt

It is certified that error appears in the above-identified patent and that said Letters Patent is hereby corrected as shown below:

In the claims:

At column 5, line 41, "of facilitating" should be --for facilitating--.

At column 5, line 53, "temperature is" should be --temperature is:--.

At column 5, line 55, "$(A_{CTE}*x*°F.)-(B_{CTE}*2*y*°F.)$" should be --$(A_{CTE}*x*°F)-(B_{CTE}*2*y*°F)$--.

At column 6, line 55, "$(A_{CTE}*x*°F.)-(B_{CTE}*2*y*°F.)$" should be --$(A_{CTE}*x*°F)-(B_{CTE}*2*y*°F)$--.

At column 8, line 55, "$(A_{CTE}*x*°F.)-(B_{CTE}*2*y*°F.)$" should be --$(A_{CTE}*x*°F)-(B_{CTE}*2*y*°F)$--.

Signed and Sealed this

Twelfth Day of April, 1994

Attest:

BRUCE LEHMAN

*Attesting Officer*  *Commissioner of Patents and Trademarks*